(12) United States Patent
Reuter

(10) Patent No.: US 8,941,534 B2
(45) Date of Patent: Jan. 27, 2015

(54) INTEGRATED CIRCUIT, COMMUNICATION UNIT AND METHOD FOR PHASE ADJUSTMENT

(75) Inventor: Ralf Reuter, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 449 days.

(21) Appl. No.: 13/377,991

(22) PCT Filed: Jul. 16, 2009

(86) PCT No.: PCT/IB2009/053080
§ 371 (c)(1),
(2), (4) Date: Dec. 13, 2011

(87) PCT Pub. No.: WO2011/007198
PCT Pub. Date: Jan. 20, 2011

(65) Prior Publication Data
US 2012/0098698 A1 Apr. 26, 2012

(51) Int. Cl.
*G01S 7/03* (2006.01)
*H03H 11/20* (2006.01)

(52) U.S. Cl.
CPC .. *G01S 7/03* (2013.01); *H03H 11/20* (2013.01)
USPC .......................................... 342/175; 327/237

(58) Field of Classification Search
USPC ................................................ 342/175, 200
See application file for complete search history.

(56) References Cited

U.S. PATENT DOCUMENTS

| | | | |
|---|---|---|---|
| 4,745,370 A | 5/1988 | McGinn | |
| 5,877,643 A | 3/1999 | Drogi | |
| 6,002,303 A * | 12/1999 | Carralero et al. | 331/117 R |
| 6,177,822 B1 | 1/2001 | Okuyama | |
| 7,271,622 B2 * | 9/2007 | Metaxakis | 327/12 |
| 7,385,452 B2 * | 6/2008 | Harjani et al. | 331/167 |
| 7,893,786 B2 * | 2/2011 | Eo et al. | 331/181 |
| 7,952,445 B2 * | 5/2011 | Bao et al. | 331/117 R |
| 2003/0090252 A1 | 5/2003 | Hazucha | |
| 2006/0055442 A1 | 3/2006 | Tanaka et al. | |
| 2011/0102093 A1* | 5/2011 | El Rai et al. | 331/117 FE |

FOREIGN PATENT DOCUMENTS

| | | |
|---|---|---|
| EP | 1067671 A1 | 1/2001 |
| JP | 07-263964 A | 10/1995 |
| WO | 2005/060041 A1 | 6/2005 |

OTHER PUBLICATIONS

Koh Kwan-Jin et al: "0.13-um CMOS Phase Shifters for X-, Ku-, and K-Band Phased Arrays" IEEE Journal of Solid-State Circuits, Nov. 2007, vol. 42, Issue: 11, pp. 2535-2546.
Hancock Timothy M et al: "A 12-GHz SiGe Phase Shifter with Integrated LNA" IEEE Transactions on Microwave Theory and Techniques, Mar. 2005, vol. 53, Issue 3, pp. 977-983.
International Search Report and Written Opinion correlating to PCT/IB2009/053080 dated Apr. 6, 2010.

* cited by examiner

*Primary Examiner* — Matthew M Barker

(57) ABSTRACT

An integrated circuit for phase shifting a radio frequency signal, wherein the integrated circuit comprises at least one phase shifter comprising: at least one input for receiving a radio frequency signal, a voltage variable element; and a plurality of active devices operably coupled to the voltage variable element and arranged to receive a variable control voltage. The plurality of active devices comprise at least two active devices coupled in a common base arrangement and arranged to receive the radio frequency signal with the voltage variable element coupling the emitter contacts or source contacts of the at least two active devices, such that a variable control voltage applied to the voltage variable element adjusts a phase of the radio frequency signal.

15 Claims, 5 Drawing Sheets

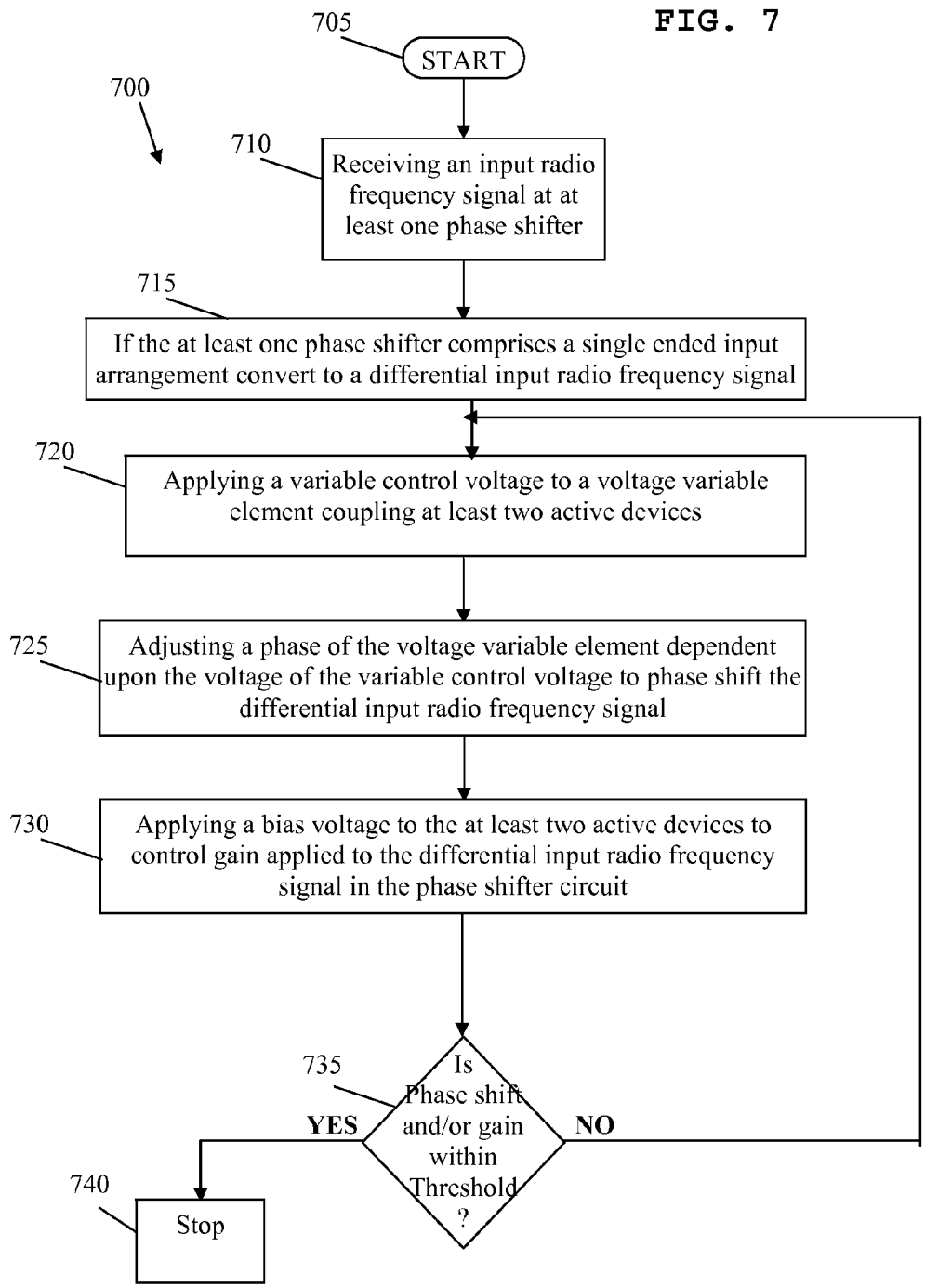

INTEGRATED CIRCUIT, COMMUNICATION UNIT AND METHOD FOR PHASE ADJUSTMENT

FIELD OF THE INVENTION

The field of this invention relates to phase adjustment of signals in a high frequency communication unit. The field of the invention is applicable to, but not limited to, an integrated circuit for a high frequency communication unit that is suitable for use in a mono-static radar system.

BACKGROUND OF THE INVENTION

RAdio Detection And Ranging, often referred to as 'Radar', is a technology that has been increasingly used in many vehicular applications, such as in adaptive cruise control, sensor-based applications, etc. A radar system is an electronic system designed to transmit radio signals and receive reflected images of those signals from a 'target' object, in order to determine the bearing and distance to the 'target'. In future, vehicle manufacturers have suggested that vehicle radar systems may additionally be employed in safety related applications, such as: determination of a vehicle starting and/or stopping, to perform pre-cash detection and potentially to instigate emergency braking, etc. One example of radar technology that has been proposed for vehicular applications uses mono-static radar technology arranged to operate in the 77 GHz frequency range.

Communication units arranged to utilise radar technology require transceiver chips, or separate transmitter and receiver circuits, to be located in close proximity to one another to improve the accuracy in determining a distance and bearing to the object. As a consequence, and particularly at typical radar frequencies where the transmit (and therefore receive) frequency is very high, such as in the 77 GHz frequency region, it is known that mono-static radar technology suffers from interference caused by poor isolation between the transmitted and received signals at these very high frequencies within the ICs themselves or within the communication units.

FIG. 1 schematically illustrates known causes of interference effects in a high frequency communication unit 100. The high frequency communication unit 100 is illustrated with respect to a receiving operation, whereby an antenna 102 receives high frequency signals and passes them to a low noise amplifier 104. Depending on the receiver design and system requirements, the low noise amplifier 104 is optional and can be thus bypassed. The received and perhaps amplified high frequency signal 106 is input to a down-converting mixer 108, which down-converts the amplified signal 106 by multiplying it with a local oscillator (LO) signal 112 that is fed from an LO source 110. The output from the down-converting mixer 108 is a desired intermediate frequency (IF) signal 114, which is typically at a very much lower frequency, than the operating frequency of the high frequency communication unit 100 such that low-pass or band-pass filtering can be used to remove or attenuate undesired signals in the frequency domain. The IF signal may be a low frequency (LF) signal, a very low IF (VLIF) signal or even a DC (zero IF) signal. As shown, and particularly with high radio frequency (RF) signals, the signals may be undesirably radiated to nearby circuits/elements/transmission lines, etc. Thus, it is known that LO signals and transmit signals may radiate directly onto the receiver path, thereby causing interference to receive signals. This interference is known as cross-talk interference or isolation cross-talk 116.

As a consequence, in order to reduce the level of interference that is radiated between internal circuits/elements/transmission lines, etc., many radar systems use ultra short transmit pulses to guarantee that the transmitter is shut-down (and therefore the transmitter oscillator signal is highly isolated from antenna) when the echo of the ultra short pulse is expected at the radar receiver. Alternatively, or additionally, radar systems may use spatially-separated antennas for the respective transmit or receive operation, with the spatially-separated antennas arranged to provide high isolation there between. It is also known that radar systems may use high-end circulators to reduce the interference effects. Each of these designs significantly add to the cost and complexity of the high frequency communication unit.

Isolation to minimise cross-talk 116 may therefore be achieved at high frequencies using high-end circulators or rat-race couplers 150, located between transmit and receive paths. A rat-race coupler 150 would typically provide less than 20 dB isolation between the two paths. Thus, for example, a radar transmit signal of 16 dBm at 77 GHz input to a rat-race coupler of 20 dB isolation would still leak −4 dBm of transmit signal 152 into the receiver chain. This level of leakage power will be significantly more than the desired receive signal. Hence, a significant portion of the transmitted signal still couples into the receiving channel/circuitry. This undesired transmitted signal acts as an additional, unwanted signal in the receiver down-mixer circuitry, thereby creating further undesired down-converted signals in the intermediate or low-frequency/baseband circuitry that degrades the complete system performance.

High frequency mixer circuits are often based on the known Gilbert cell type. The Gilbert cell type is an active mixer that provides a conversion gain instead of conversion loss. However, the linearity of such active mixers is known to be limited. Thus, in a mono-static radar system, where the signal leakage may easily exceed −4 dBm, the mixer should still be able to operate in a linear mode with such a high leakage level. To achieve this level of linearity, the input referred 1-dB compression point, which is a measure for the linearity of the receiver, must be designed with sufficient margin compared to the maximum input power. As a rule of thumb, the compression point is calculated as: 10 dB plus the maximum power level. Thus, in the above example when the leakage level is −4 dBm, the desired 1-dB compression point is in the region of +6 dBm. Hence, the design of such extremely linear mixer cores requires high supply voltages and extremely high current densities in the transistors. As active Gilbert-cell mixers cannot support this combination of competing system parameters, a trade-off is often made, for example the output power of the transmitter is often reduced to lower the cross-coupled leakage into the receiver path. However, a lower transmitted power will reduce the signal-to-noise ratio (SNR) of the system, which in turn degrades the system performance. To overcome this problem, the cross-coupled signal into the receiver needs to be cancelled using an alternative approach.

Typically, the cancellation of such signals requires a provision of an accurate anti-phase version of the signal to be cancelled. Thus, the phase effects of radio frequency (RF) circuits, such as Gilbert cell mixers, are difficult to be compensated for as implementing controllable phase shifter technology at such high frequencies is generally practically unrealizable due to cost, size and/or isolation performance constraints.

Current techniques for compensating for phase shift also include laser trimming of transmission lines on integrated circuits (ICs), which consequently adjust the phase shift effect of the transmission line on RF signals that the transmission line is passing.

WO2005060041, titled 'A simplified phase shifter' describes a fixed phase shifter design and layout whereby individual phase shifters need to be selected for each particular application.

SUMMARY OF THE INVENTION

The present invention provides an integrated circuit, a communication unit and method for phase compensation as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

FIG. 7 illustrates a flowchart of an example phase compensation process employed in a high frequency communication unit.

DETAILED DESCRIPTION

Figure 1:
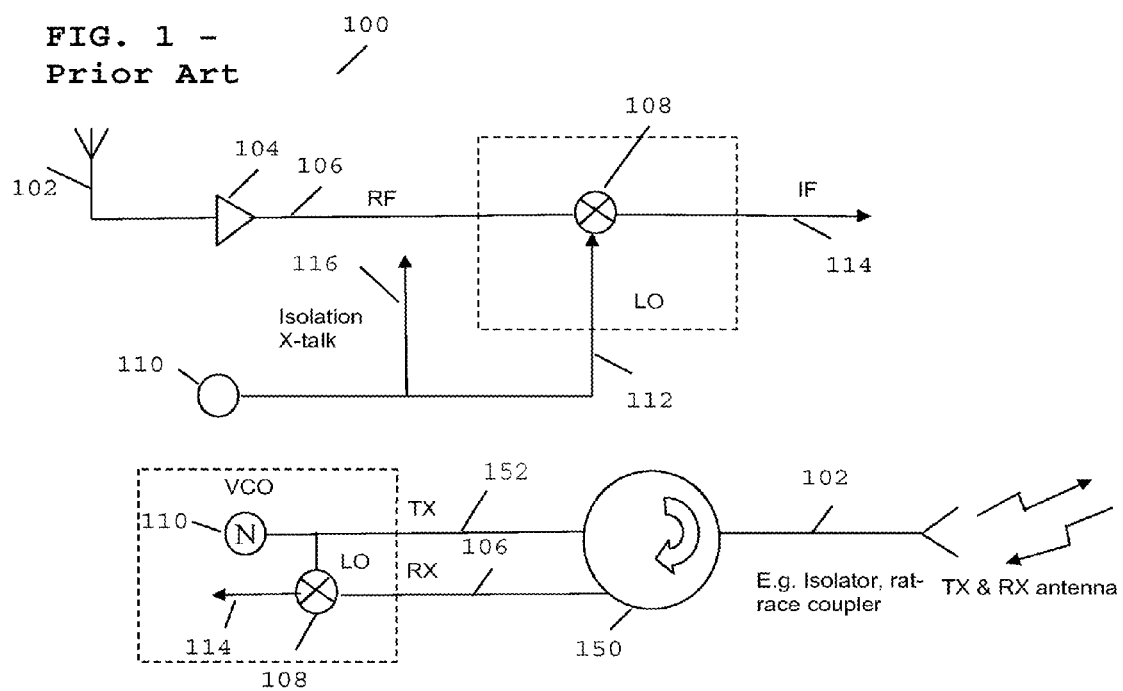
FIG. 1 schematically illustrates known causes of interference effects in a high frequency communication unit.

Before describing in detail particular examples, it should be observed that the apparatus, components and method steps have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein.

In one example, a technique is described that improves a performance of, say mono-static radar systems (77 GHz), by implementation of a method to electronically adjust a phase shift of a compensating radio frequency (RF) signal. In one example, a phase adjustment circuit is described that is based on active devices (e.g. hybrid bi-polar transistors (HBTs)) together with one or more variable capacitors, for example in a form of varactors, which is arranged to adjust any differential phase efficiency, even at very high frequencies. In one example, a plurality of phase adjustment circuits may be cascaded such that a total phase shift of a differential RF signal can be adjusted, whilst simultaneously achieving the desired gain and maintaining full stability (by checking the stability of each cascaded circuit) and achieving acceptable component matching. In one example implementation, the proposed technique may be used to adjust a phase of RF signals in a radar system by using a real-time, dynamic feedback arrangement to dynamically and automatically adjust a phase compensation signal. Advantageously this mechanism may provide a way to achieve an improved signal-to-noise ratio (SNR). In one example implementation, the phase adjustment circuits may be used within a mixer circuit to achieve a phase shift of a signal that is not in the direct transmit or receive signal path and is able to take into account any phase effect of bond wires and off-chip elements caused to transmit or receive signals.

Figure 2:
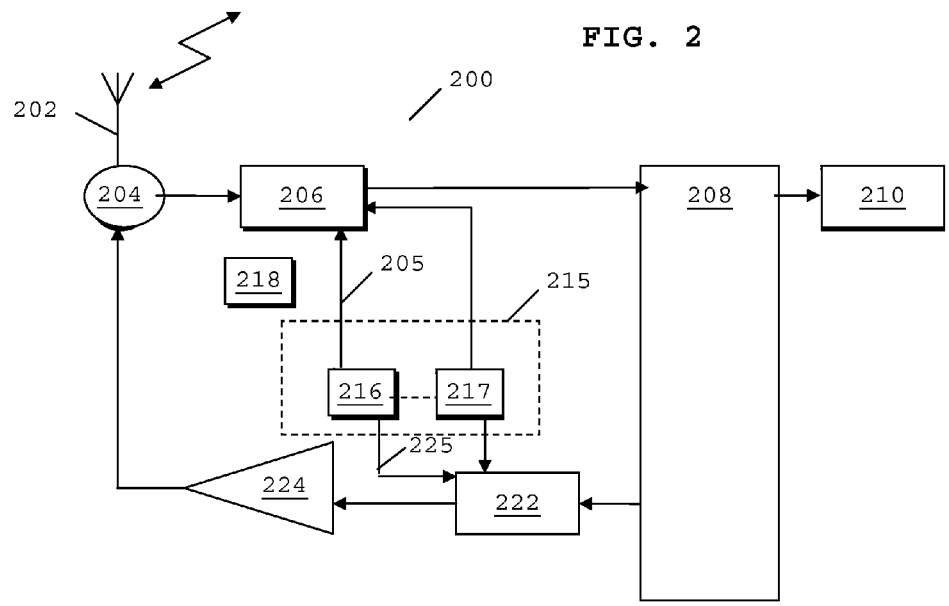
FIG. 2 illustrates a block diagram of an example of a high frequency communication unit.

Referring now to FIG. 2, a simplified block diagram of an example of a high frequency communication unit 200 is shown. In practice, purely for the purposes of explaining example implementations of the invention, the high frequency communication unit is described in terms of a mono-static radar communication unit 200, although the functional elements are recognized as being similar or equivalent to those found in most wireless communication units. The high frequency communication unit 200 contains an antenna 202, which in this example is operably coupled to a rat race coupler 204 that provides isolation between receive and transmit chains within the high frequency communication unit 200.

The receiver chain, as known in the art, includes receiver front-end circuitry 206 (effectively providing one or more of the following functions: signal reception, signal amplification, signal filtering and down conversion of the received high frequency signal to an intermediate frequency or base-band frequency signal). The front-end circuitry 206 is serially coupled to signal processing logic 208. An output from the signal processing logic 208 is provided to a suitable output device 210. In a vehicle radar application, examples of the output device 210 may comprise an indication on a vehicle dashboard or electro-mechanical braking equipment to potentially instigate emergency braking, or a separate air-bag controller circuitry when performing pre-cash detection, etc.

A controller 217 maintains overall control of the high frequency communication unit 200. The controller 217 is also coupled to the receiver front-end circuitry 206 and the signal processing logic 208 (generally realized by a digital signal processor (DSP)). The controller 217 may also be coupled to a timer 218 arranged to control the timing of operations (transmission or reception of time-dependent signals) within the high frequency communication unit 200.

As regards the transmit chain, this essentially comprises transmitter/modulation circuitry 222 and a high frequency power amplifier 224 coupled to the antenna 202 via the rat race coupler 204. The transmitter/modulation circuitry 222 and the power amplifier 224 may be operationally responsive to the controller 217.

The signal processor logic 208 in the transmit chain may be implemented as distinct from the processor in the receive chain. Alternatively, a single processor 208 may be used to process both transmit and receive signals, as shown in FIG. 2. Clearly, the various components within the high frequency communication unit 200 can be realized in discrete or integrated component form, with an ultimate structure therefore being application-specific or purely a design selection.

In this example, the high frequency communication unit 200 comprises a frequency generation circuit 216 that is operably coupled to both the transmitter/modulation circuitry 222 in the transmitter chain and the front-end circuitry 206 in the receiver chain. The frequency generation circuit 216 is arranged to provide phase compensated local oscillator signals 205, 225 to either, or both, of the transmitter/modulation circuitry 222 and the front-end circuitry 206.

In this example, the frequency generation circuit 216 and the controller 217 may be formed within the same integrated circuit (IC) package 215. In other examples, the frequency generation circuit 216 and the controller 217 may be formed within separate or distinct IC packages or as separate lumped elements or circuits. In other examples, the frequency generation circuit 216 and/or the controller 217 may be formed within the same IC package as a portion of, or encompassing all of, the transmitter/modulation circuitry 222 and/or front-end circuitry 206, for example by encompassing the up-mixing and/or down-mixing elements or circuits (not shown).

Figure 4:
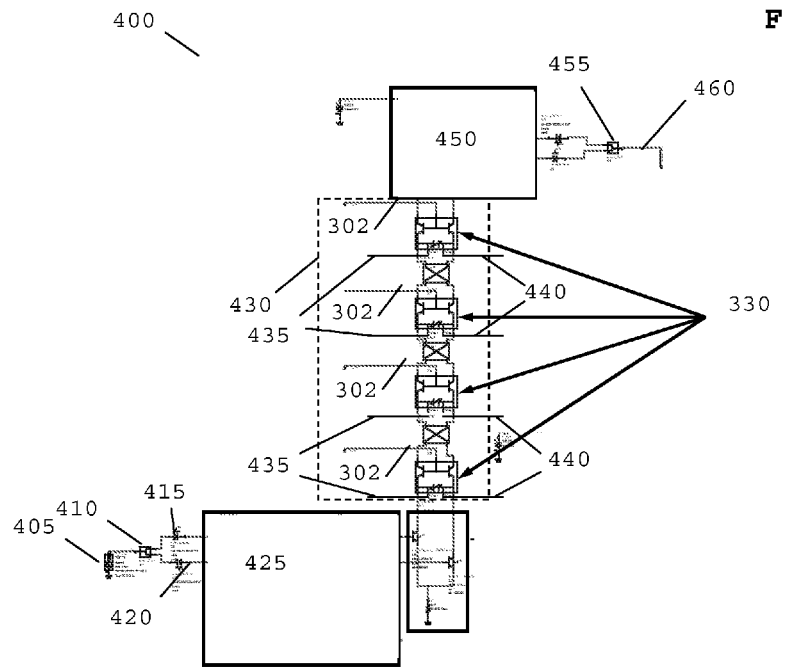
FIG. 4 illustrates an example of a fully differential phase shifter arrangement.

The frequency generation circuit 216 may comprise (or be operably coupled to) a frequency generation source, such as a crystal oscillator (hereinafter referred to as a local oscillator (LO)). The LO may be operably coupled to an adaptive electrically adjustable phase shifter, which may be implemented by electrically adjusting a phase shift to be applied to the LO signals using phase shifter circuits comprising active devices and varactors, as shown in FIG. 4.

In one example, the use of active devices and varactors is employed to phase shift differential signals, as described with reference to FIG. 4. In particular, by cascading a plurality of such phase shifter circuits in a frequency generation circuit where the phase shift of a signal generated by the signals is applied to a frequency compensation signal, the total phase shift of the frequency generation circuit 216 can be adjusted, whilst simultaneously achieving the desired signal gain, full stability and acceptable matching. In one example, the approach can be used to adjust, say, a frequency adjustment signal to be applied to an up-mixer or down-mixer operation of the frequency generation circuit 216 to achieve a phase shift with an improved signal-to-noise ratio (SNR). In applying the phase-shift compensation to the LO signal, potentially degrading the noise performance of the receiving path may be avoided. The operation and function of the phase shifter circuit, for example for use in the frequency generation circuit 216, is described further in the operational description below.

Figure 3:
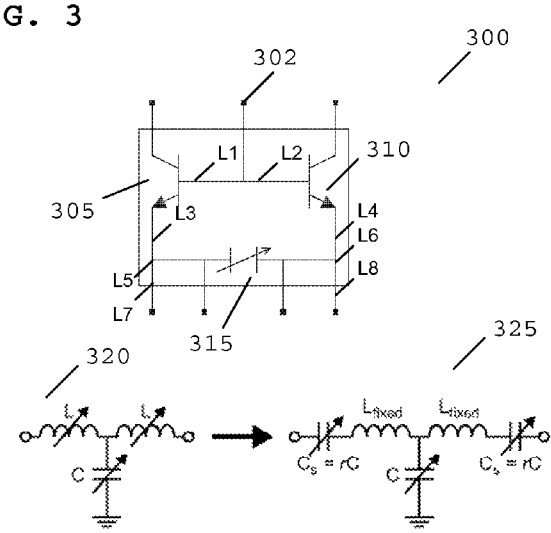
FIG. 3 illustrates a block diagram of a more detailed example of a high frequency communication unit circuit.

Referring now to FIG. 3, one example topology of an electrically adjustable active phase shifter circuit 300 is illustrated. The electrically adjustable active phase shifter circuit comprises two active devices 305, 310, which may be in any suitable form, for example bipolar junction transistors (BJTs), hybrid bi-polar transistors (HBTs), conductive metal oxide semiconductor (CMOS) devices, etc., are connected in a differential common base arrangement. The base contacts of the two active devices 305, 310 are connected together via a capacitance to an analogue ground (common base). A voltage bias is applied to the two active devices 305, 310 via a voltage applied through a resistor (not shown). The impact on layout parasitics, in a corresponding simulation model, may be taken into account by transmission line segments L1 up to L8. The emitters of both common base transistors are coupled via an electronically controlled variable capacitor 315. Circuits 320, 325 illustrate two example implementations of the electronically controlled variable capacitor 315.

In a typical realization the electronically controlled capacitor 315 is based on a varactor (voltage controlled capacitor). However, in other example implementations, any element that is able to cause a change of effective capacitance and/or inductance may be used, for example switchable capacitors by metal oxide semiconductor field effect transistors (MOSFETs), by MEMS, etc. In some examples, de-coupling of the varactor biasing from the bias points at the emitter of the common base transistors 305, 310 may be realized by lumped capacitors. By applying a voltage to the bias ports, the effective capacitance between the emitter contacts of the common base transistors may be controlled and dynamically adjusted. By varying the effective capacitance, the phase shift between the emitter contacts will also be varied, which will further change the absolute phase of the phase shift circuit.

Referring now to FIG. 4, an example illustration 400 of an implementation using a plurality of cascaded phase shift circuits, functioning as a fully, electronically controllable differential phase shifter, is shown. In the example illustration 400, differential input signals 415, 420 are provided by a balun 410 that is fed from a single-ended signal source 405. The differential input signals 415, 420 are provided to an input matching stage 425, for example using known transmission line matching techniques. The output from the input matching stage 425 is input to a differential input stage 430 comprising two transistors. The voltage gain of the circuit is realized by the differential input stage 430. The output from the two transistors of the differential input stage is input to an electrically adjustable phase shifter block 430.

The electrically adjustable phase shifter block 430 comprises a plurality of phase shifter circuits 330, which can be cascaded as shown to achieve the required total phase variation from the input to the output. A constant bias signal 302 is applied to each of the active devices of the phase shifter circuits 330. The maximum number of phase shifter circuits 330 that can be cascaded in a phase shifter block 430 is only limited by the total supply voltage of the circuit. The number of phase shifter circuits 330 used in the phase shifter block 430 may be selected based on the active circuit technology used and/or the phase shift that may be required at a particular operating frequency.

Each of the phase shifter blocks 430 are controlled using analog control voltages P_Var_p 440 and P_Var_n 435 to adjust the effective capacitance of a varactor (say, varactor 315 in FIG. 3). The analog control voltages for each of the stages are connected together, where the difference between these two voltages is defined as control/varactor voltage (VVar):

$$VVar = P\_Var\_p - P\_Var\_m \quad [1]$$

In this manner, different levels of VVar correspond to different phase shifts, with typically higher VVar voltages corresponding to higher phase shifts The differential output from the phase shifter block 430 is provided to an output matching circuit 450, for example implemented using known transmission line matching techniques. The matched differential output from the output matching circuit 450 is combined by a balun 455 and output to a 50 Ohm load 460.

In one example, different phase shifts may be set using different voltages applied to the transistor common base arrangement of the phase shifter circuit. For example, each phase shifter circuit may be arranged to cover a particular phase shift range, e.g. a first circuit of the cascaded set of phase shifter circuits may be set to roughly covers the range 0-50 deg., the second circuit arranged to more accurately cover a smaller range of, say, 0-20 deg., the third circuit arranged to more accurately cover a smaller range of, say, 0-10 deg. and the fourth circuit arranged to more accurately cover a smaller range of, say, 0-5 deg.

In one example, the phase shift provided by a single phase shifter circuit 300 or a cascade of phase shifter blocks 430 may be adjusted by either an analogue or even digital control signal, for example using signal processing logic (not shown) to receive and process suitable input signals and output appropriate control voltages Var_p and Var_m. For example, an internal analog control signal VVar may be generated from a digital signal provided by the signal processing logic by a digital-to-analog (D/A) converter on chip.

Figure 5:
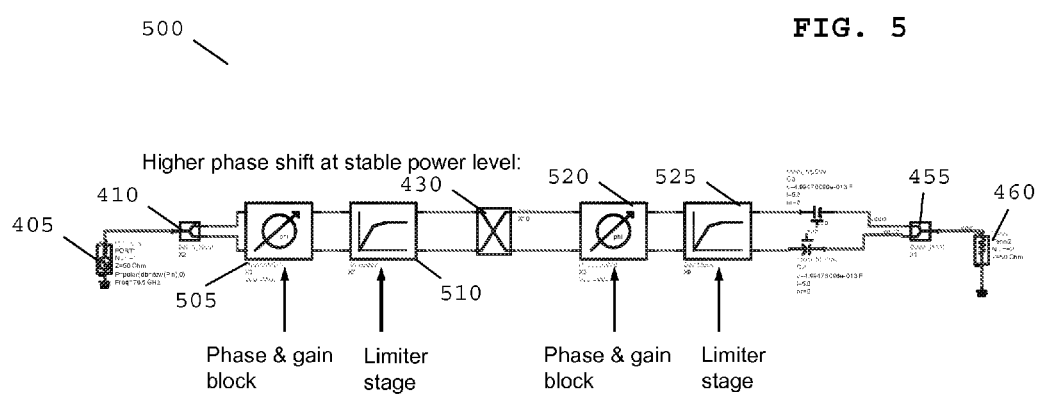
FIG. 5 illustrates an example of a fully differential phase shifter arrangement employing a limiter.

In the above example, the total phase shift may be adjusted using a plurality of cascaded phase shifter circuits. However, in such an example, the gain of the phase shifter is also varying. Therefore, referring now to FIG. 5, an example implementation 500 that proposes a use of one or more 30 limiter stage(s) arranged to limit the output amplitude/power to the desired level, and thereby compensate for a varying gain of the phase shifter circuits, is shown. The use of a limiter stage enables the signal that is undergoing differential phase shifting to be amplitude limited, thereby ensuring that the gain of the phase shifter block 340 can also be controlled.

In this architecture two phase shift & gain blocks 505, 520 are used to further increase the total phase shift from the input to the circuit via input port 405 to the output port 460. Each phase & gain block 505, 520 is followed by a limiter stage 510, 525 which is arranged to saturate the output power/level to the desired value.

In a monostatic radar system the key figure of merit (FoM) is that the RF circuit should be designed to have as high a signal-to-noise ratio performance as possible in the intermediate frequency (IF) domain. Due to the usage of one common antenna for both the transmit (Tx) path and receive (Rx) path, the isolation between the transmitting and receiving path is always limited. In this case a portion of the Tx signal is, thus, fed into the Rx path. For example, as the monostatic radar system transmit power is high (typically of the order of +15 dBm) even a Tx/Rx isolation performance of 20 dB results in a leakage signal of approximately −5 dBm into the Rx input. As the receiver is required to successfully recover extremely low RF power levels (for example in the range of −70 dBm to −20 dBm), with optimum noise performance, the parasitic Tx signal dominates the receiver performance. Thus, in order to achieve a sufficient noise margin, the linearity of the receiver channel must be extremely high. Hence, in order to obtain an acceptable SNR the parasitic Tx signal at the Rx input must be sufficiently cancelled by a signal with opposite phase and equal in amplitude.

As explained below in more detail, in the illustrated examples, an electrically adjustable phase shifter is achieved by adaptive electrical adjustment of an active phase shifter. In the aforementioned examples, the electrically adjustable phase shifter may be implemented in a communication unit for use in a frequency modulated constant wave (FMCW) radar system, such as a mono-static radar system, in contrast to the known techniques of using expensive laser trimming or selecting from a number of integrated circuits that apply timed phase shifts. However, the example of a use in a mono-static radar system is just one of many example applications. For example, the electrically adjustable phase shifter may be implemented in any communication unit or system that employs an active mixer (e.g. an up/down frequency conversion circuit or device) where DC offset, namely DC balance between the differential intermediate frequency (IF) outputs, is a problem. Furthermore, for example, the electrically adjustable phase shifter may be implemented in any high frequency heterodyne or homodyne system or communication unit where the down-converted IF may be considered as being relatively close to DC, with respect to the high operating frequency of the communication unit, for example where the IF is less than 0.01% of the high frequency. Such examples may include any IF frequency, especially including zero IF (equating to DC).

As explained below in more detail, in the shown examples, the adaptive electrically adjustable phase shifter is arranged to adjust the phase-shift of signals at high (e.g. many GHz) frequencies, where existing implementations may be too complex to realize or may consume too much power. For example, in utilising active devices, the aforementioned examples create less loss and therefore require less power-creating circuits. Furthermore, for example, the aforementioned examples may be implemented at a much lower cost, using an inexpensive varactor-based phase adjustment, as compared to the known and expensive laser trimming technique. In some examples, the phase shift that is applied may be controlled by the analogue control voltage that is applied to the phase shift circuit.

Although the aforementioned examples are described with reference to a 77 GHz mono-static radar system, other example implementations may be applied to any frequency range. The example adaptive electrically adjustable phase shifter may be realized using a variety of different integrated circuit technologies and may be realized, in some examples, using fully differential signals, as described previously. Furthermore, the examples may be implemented using either bipolar transistors or using MOS devices.

In the following, a mechanism is described for phase compensating a local oscillator signal to be applied to a receiver/transmitter chain in a frequency conversion operation, as an example. However, the same technique may be used to adjust a phase in any high frequency radio frequency path, for example a radio frequency receiver and/or transmitter path.

Figure 6:
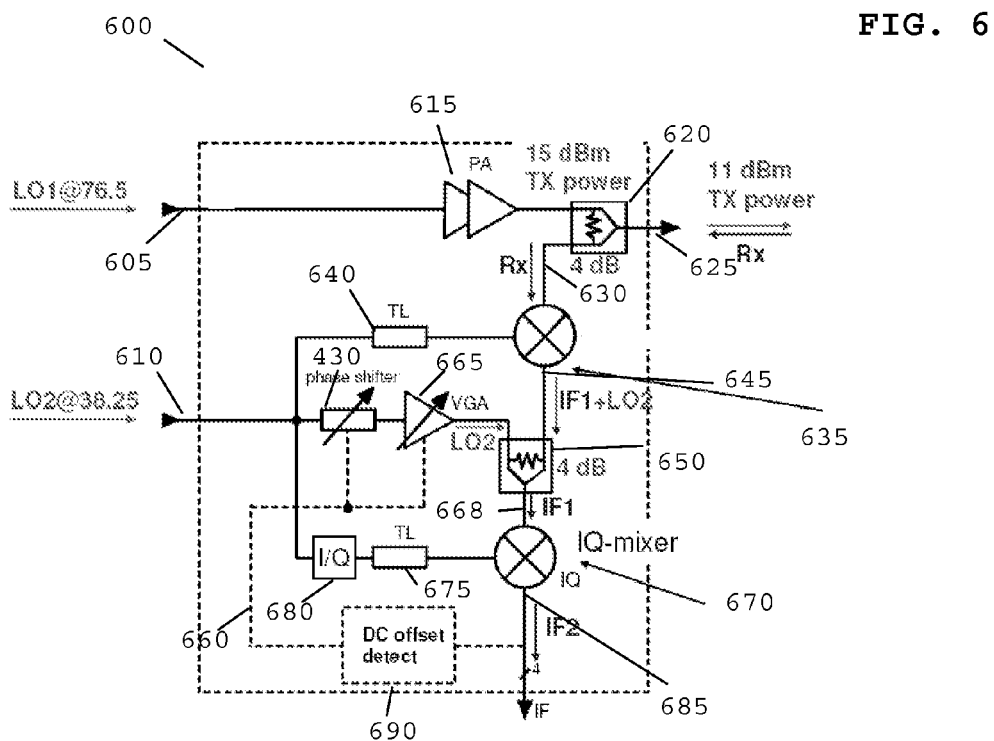
FIG. 6 illustrates a block diagram of an example of a high frequency communication unit, suitable for a mono-static radar architecture.

Referring now to FIG. 6, an example of a high frequency communication unit suitable for a mono-static radar architecture 600 is illustrated where the radar architecture 600 uses an electronically controlled phase shifter to substantially cancel the Tx leakage at the Rx input. In the example shown, the cancellation is performed after the first down-conversion stage. The mono-static radar architecture 600 comprises a transmit signal 605, which may in some examples be considered as a LO signal or an RF pulse operating at 76.5 GHz being input to a power amplifier 615. The output from the power amplifier 615 is input to, say, a first port of a Wilkinson divider 620. Typically, the PA output may in a region of +15 dBm, with a 4 dB insertion loss of the Wilkinson divider 620 leaving an output power of the transmit signal 625, output from a second port of the Wilkinson divider 620, being of the order of +11 dBm, which is input to an antenna (not shown). The Tx parasitic signal appearing at the (receiver) third port of the Wilkinson divider 620, assuming an isolation performance of 20 dB, is −5 dBm, which will be significantly higher than the received signal that is also fed to the third part.

In a receive mode of operation, the received signal is fed from the antenna (not shown) to the second port of the Wilkinson divider 620 and appears at the third port after undergoing a typical insertion loss of 4 dB. Thus, the composite signal 630 that is applied to highly-linear down-mixer 635 comprises a very low level received signal together with the relatively high level Tx parasitic signal. In highly-linear down-mixer 635, composite signal 630 is mixed with a 38.25 GHz local oscillator signal 610, arranged to be half of the operating frequency of 76.5 GHz, and fed via transmission line 640. Thus, the signal 645 output from the highly-linear down-mixer 635 comprises the desired received signal at intermediate frequency signal (IF1) and the Tx parasitic signal (LO2), both at a frequency of 38.25 GHz.

Signal 645 is input to a first port of a second Wilkinson divider 650, where it is combined with a phase and amplitude shifted version of the 38.25 GHz local oscillator signal 610 input to a third port of the second Wilkinson divider 650. The signal 668 output from a second port of the second Wilkinson divider 650 is input to a quadrature mixer 670, where it is multiplied with an I-Q version of the 38.25 GHz local oscillator signal 610. The 38.25 GHz local oscillator signal 610 is input to I/Q logic 680, which is capable of providing a more efficient way of simultaneously acquiring the target information regarding speed and distance, and passed to the quadrature mixer 670 via transmission line 675.

Signal 685 that is output from the I-Q mixer 670 is, thus, at a very low second intermediate frequency (IF2), which in this example is at 0 Hz. Signal 685 is then input to further decoding and demodulation circuitry (not shown) in the mono-static radar architecture. In one example, signal 685 is also input to DC offset detection logic 690, which is arranged to detect any DC offset in the down-converted received signal created due to the leakage into the receive path of the Tx parasitic signal. The DC offset detection logic 690 comprises signal processing logic arranged to determine from the very low second intermediate frequency whether a DC offset exists, and if so, in response thereto, to control via control signal 660 the phase shift applied by phase shifter 430 and gain provided by variable gain amplifier 655. The phase shifter is arranged to generate a 'complementary' LO signal at 38.25 GHz, from the 38.25 GHz local oscillator signal 610 that is input to the phase shifter 430, and the variable gain amplifier (VGA) 665.

In this manner, the signal LO2∠(+180) generated by the phase shifter is combined with the signal IF1+LO2∠ by the second Wilkinson divider 650. In this way, the Tx parasitic signal LO2 is substantially cancelled and only the desired IF1 signal remains and is applied at the input port of the I/Q mixer 670.

Hence, the use of a feedback arrangement, for example in a form of DC offset detection logic 690 coupled to electrically adjustable phase shifter 430, and VGA 665 the phase and amplitude of the received signal may be maintained in a range to obtain an acceptable signal-to-noise ratio.

Furthermore, a single-side band Noise Figure (NFssb) of the mono-static radar architecture 600 may be improved by an order of >10 dB by selecting the right phase to be applied to the compensating RF signal (namely second LO signal 610).

In other example implementations, other circuit components and configurations may be used that employ the concepts herein described. For example, in one example implementation, a rat-race coupler may be used in contrast to a Wilkinson divider.

In the above examples, the noise performance of the receiver system can be significantly improved, both generally and when the high frequency communication unit is operating in compression. Using such actively controlled compensation techniques, the requirements on the active mixer core can be drastically reduced, thereby resulting in lower total power consumption and significantly improved system signal-to-noise ratio (SNR) performance. Thus, an active real-time feedback system is provided, which will automatically adjust the phase of an RF signal based on the signal-to-noise ratio (SNR) of the down-converted IF signal. Furthermore, the aforementioned examples may be applied to any RF operating frequency, and thereafter any IF or baseband frequency.

Referring now to FIG. 7, a flowchart 700 illustrates an example phase compensation process employed in a high frequency communication unit that is suitable for a mono-static radar application. The phase compensation process adjusts a phase and/or a gain of a frequency-dependent signal by electrically adjusting a phase and/or amplitude of a frequency-dependent signal. The electrical phase adjustment may be performed by the example circuit of any of FIG. 3 or FIG. 4 or FIG. 5 or FIG. 6. The example flowchart of FIG. 7 is described with respect to an operation in a mono-static radar communication unit, where transmit signals and receive signals operate at the same frequency (Fo).

After commencing in step 705, for example due to turn 'on' of the high frequency communication unit, an input radio frequency signal is received at the at least one phase shifter circuit, as shown in step 710. If the at least one phase shifter comprises a single ended input arrangement, the process converts a single ended radio frequency signal to a differential input radio frequency signal, as shown in step 715. After ensuring that there is a differential input radio frequency signal, the process continues by applying a variable control voltage to a voltage variable element coupling at least two active devices, as shown in step 720.

Thereafter, the process continues with adjusting a phase of the voltage variable element, dependent upon a voltage applied to the variable control voltage. Thus, in this manner, the variable control voltage applies a phase shift to the differential input radio frequency signal, as shown in step 725. The process continues with applying a bias voltage to the at least two active devices of the phase shifter circuit to control a gain applied to the differential input radio frequency signal in the phase shifter circuit, as shown in step 730. A determination is then made as to whether the adjusted phase shift and/or gain setting are within respective thresholds, as shown in step 735. If the adjusted phase shift and/or gain setting are within respective thresholds, the process stops in step 740. If the adjusted phase shift and/or gain setting are not within respective thresholds, the process loops back to step 720 and further adjustment of the phase and/or gain level of the differential input radio frequency signal is performed.

It will be understood that the examples of a high frequency communication unit, integrated circuit and method for electrically adjusting a phase of a high frequency signal in a high frequency communication unit, as described above, may enable a communication unit to improve phase control of the signals routed therein. In addition, the examples may improve a noise performance of the receiver system, both generally and when the high frequency communication unit is in compression. Furthermore, the examples may provide an active feedback system that may adjust the phase automatically, based on the SNR of the IF signal. Moreover, the examples may support a phase control implementation that is fully digitally controlled.

Those skilled in the art will realize that the above recognized advantages and other advantages described herein are merely exemplary and that the invention does not require all of these advantages to be obtained.

It will be appreciated that the examples described herein may be comprised of one or more generic or specialized processors (or 'signal processors') such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and apparatus for performing power control described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Both the state machine and ASIC are considered herein as a 'signal processor' for purposes of the foregoing discussion and claim language.

Moreover, an embodiment of the invention can be implemented as a computer-readable storage element having computer readable code stored thereon for programming a computer (e.g., comprising a processing device) to perform a method as described and claimed herein. Examples of such computer-readable storage elements include, but are not limited to, a hard disk, a CD-ROM, an optical storage device, a magnetic storage device, a Read Only Memory (ROM), a Programmable Read Only Memory (PROM), an Erasable Programmable Read Only Memory (EPROM), an Electrically Erasable Programmable Read Only Memory (EEPROM) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

In the foregoing specification, specific embodiments of the invention have been described. However, one of ordinary skill in the art appreciates that various modifications and changes can be made without departing from the scope of the invention as set forth in the claims below.

Accordingly, the specification and figures are to be regarded in an illustrative rather than a restrictive sense, and all such modifications are intended to be included within the scope of invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims, including any amendments made during the prosecution of this application and all equivalents of those claims as issued.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Moreover in this document, relational terms such as first and second, top and bottom, and the like may be used solely to distinguish one entity or action from another entity or action without necessarily requiring or implying any actual such relationship or order between such entities or actions. The terms 'comprises', 'comprising', 'has', 'having', 'includes', 'including', 'contains', 'containing' or any other variation thereof, are intended to cover a non-exclusive inclusion, such that a process, method, article, or apparatus that comprises, has, includes, contains a list of elements does not include only those elements, but may include other elements not expressly listed or inherent to such process, method, article, or apparatus. An element proceeded by 'comprises . . . a', 'has . . . a', 'includes . . . a', 'contains . . . a' does not, without more constraints, preclude the existence of additional identical elements in the process, method, article, or apparatus that comprises, has, includes, contains the element. The terms 'a' and 'an' are defined as one or more, unless explicitly stated otherwise herein.

The terms 'substantially', 'essentially', 'approximately', 'about' or any other version thereof, are defined as being close to as understood by one of ordinary skill in the art. The term 'coupled' as used herein is defined as connected, although not necessarily directly and not necessarily mechanically. A device or structure that is 'configured' in a certain way is configured in at least that way, but may also be configured in ways that are not listed.

The invention claimed is:

1. An integrated circuit for phase shifting a radio frequency signal, wherein the integrated circuit comprises:
    at least one phase shifter comprising:
        at least one input for receiving a radio frequency signal, a voltage variable element; and
        a plurality of active devices operably coupled to the voltage variable element and arranged to receive a variable control voltage,
    wherein the plurality of active devices comprise at least two active devices coupled in a common base arrangement and arranged to receive the radio frequency signal with the voltage variable element coupling the emitter contacts or source contacts of the at least two active devices such that a variable control voltage applied to the voltage variable element adjusts a phase of the radio frequency signal.

2. The integrated circuit of claim 1 wherein the radio frequency signal that is adjusted is a differential radio frequency signal.

3. The integrated circuit of claim 2 wherein the input radio frequency signal is one of: a differential radio frequency input signal; a single ended input signal that is converted to a differential radio frequency signal for adjustment by a balun.

4. The integrated circuit of claim 1 wherein the voltage variable element is an electrically controlled variable capacitor.

5. The integrated circuit of claim 1 wherein the phase shifter comprises a plurality of cascaded phase shifters, such that a total phase shift implemented across the plurality of cascaded phase shifters is adjustable.

6. A communication unit comprising:
    a radio frequency circuit having at least one phase shifter circuit arranged to phase shift a radio frequency input signal, where the at least one phase shifter circuit comprises:
        a voltage variable element; and
        a plurality of active devices, operably coupled to the voltage variable element and arranged to receive a variable control voltage;
    wherein the plurality of active devices comprise at least two active devices coupled in a common base arrangement and arranged to receive the radio frequency input signal with the voltage variable element coupling the emitter contacts or source contacts of the at least two active devices; and
    processing logic arranged to apply a variable control voltage to the plurality of active devices to adjust a phase of a radio frequency input signal.

7. The communication unit of claim 6 wherein the phase shifter circuit is arranged to apply the phase shift to a local oscillator signal, said local oscillator signal applied to at least one of a transmit signal and a receive signal.

8. The communication unit of claim 7 wherein the communication unit supports transmit signals and receive signals operating on the same radio frequency.

9. The communication unit of claim 7 adapted to operate in a mono-static radar system.

10. The communication unit of claim 6 wherein the communication unit supports transmit signals and receive signals operating on the same radio frequency.

11. The communication unit of claim 10 adapted to operate in a mono-static radar system.

12. The communication unit claim 6 adapted to operate in a mono-static radar system.

13. A method for compensating a phase of signals in a communication unit comprising a radio frequency circuit having a phase shifter circuit comprising a plurality of active devices having at least two active devices coupled in a common base arrangement and a voltage variable element coupling the emitter contacts or source contacts of the at least two active devices, the method comprising:
- receiving a radio frequency input signal; and
- applying a voltage variable control signal to the voltage variable element in the phase shifter circuit such that the voltage variable element adjusts a phase of the radio frequency input signal.

14. A non-transitory to computer-readable storage element having computer readable code stored thereon for programming a processor to compensate signal phase in a communication unit comprising a radio frequency circuit having a phase shifter circuit comprising a plurality of active devices having at least two active devices coupled in a common base arrangement and a voltage variable element coupling the emitter contacts or source contacts of the at least two active devices, wherein, when executed, the code causes the processor to apply a voltage variable control signal to the voltage variable element in the phase shifter circuit such that the voltage variable element adjusts a phase of a radio frequency input signal received by the phase shifter circuit.

15. The non-transitory computer-readable storage element of claim 14 wherein the computer readable storage element comprises at least one of: a hard disk, a CD-ROM, an optical storage device, a magnetic storage device, a Read Only Memory, ROM, a Programmable Read Only Memory, PROM, an Erasable Programmable Read Only Memory, EPROM, an Electrically Erasable Programmable Read Only Memory, EEPROM and a Flash memory.

* * * * *